(12) United States Patent
Premont et al.

(10) Patent No.: US 6,838,916 B2
(45) Date of Patent: Jan. 4, 2005

(54) METHOD OF GENERATING A VOLTAGE RAMP AT THE TERMINALS OF A CAPACITOR, AND CORRESPONDING DEVICE

(75) Inventors: Christophe Premont, Grenoble (FR); David Chesneau, Markt Schwaben (DE); Christophe Bernard, Claix (FR)

(73) Assignee: STMicroelectronics S.A. (FR)

( * ) Notice: Subject to any disclaimer, the term of this patent is extended or adjusted under 35 U.S.C. 154(b) by 0 days.

(21) Appl. No.: 10/352,776

(22) Filed: Jan. 28, 2003

(65) Prior Publication Data

US 2003/0222688 A1 Dec. 4, 2003

(30) Foreign Application Priority Data

Feb. 4, 2002 (FR) .............................................. 02 01302

(51) Int. Cl.[7] .................................................. H03K 4/06
(52) U.S. Cl. ........................ 327/132; 327/134; 323/242
(58) Field of Search ................................ 327/131–137; 323/242, 282

(56) References Cited

U.S. PATENT DOCUMENTS

| | | | |
|---|---|---|---|
| 4,079,294 A | 3/1978 | Teuling ...................... 315/411 |
| 4,316,242 A | * 2/1982 | Colangelo et al. ........ 363/21.17 |
| 5,589,759 A | * 12/1996 | Borgato et al. ............. 323/222 |
| 5,815,380 A | 9/1998 | Cuk et al. ...................... 363/16 |
| 5,963,439 A | * 10/1999 | Wuidart et al. ............... 363/46 |
| 5,969,513 A | 10/1999 | Clark .......................... 323/282 |
| 6,359,796 B2 | * 3/2002 | Hartular et al. ............... 363/50 |

OTHER PUBLICATIONS

Kazimierczuk, et al., "Feedforward Control of CD-CD PWM Boost Converter", *IEEE Transactions on Circuits and Systems I: Fundamental Theory and Applications*, IEEE Inc., New York, vol. 44, No 2 pp. 143–148, XP000655372, dated Feb. 1, 1997.

* cited by examiner

*Primary Examiner*—Minh Nguyen
(74) *Attorney, Agent, or Firm*—Jenkens & Gilchrist, P.C.

(57) ABSTRACT

A ramp capacitor CAP1 has a first terminal connected to a power supply voltage VBAT. A generator circuit is connected to a second terminal of the ramp capacitor and adapted to generate a voltage ramp at the terminals of the ramp capacitor. The generator circuit includes a constant current source SCC connected to the second terminal B12 of the ramp capacitor CAP1 and auxiliary circuit MAX adapted in the presence of a transient variation of the power supply voltage to determine the transient current flowing in the ramp capacitor and generated by the transient variation. Responsive thereto, delivery is made to the second terminal B12 of the ramp capacitor CAP1 of a charging current equal to the algebraic sum of the constant current delivered by the constant current source and an auxiliary current equal and opposite to the transient current.

31 Claims, 5 Drawing Sheets

METHOD OF GENERATING A VOLTAGE RAMP AT THE TERMINALS OF A CAPACITOR, AND CORRESPONDING DEVICE

PRIORITY CLAIM

The present application claims foreign priority from French Patent Application No. 0201302 filed Feb. 4, 2002, the disclosure of which is hereby incorporated by reference.

BACKGROUND OF THE INVENTION

1. Technical Field of the Invention

The present invention relates to the generation of a voltage ramp at the terminals of a capacitor and, in particular, to the generation of a voltage ramp for use in a slope compensator unit of a switching mode power supply unit. Although not intended to be limiting of the invention, the present invention applies with advantage to battery-powered portable systems, especially remote terminals of wireless communication systems (for example, cellular mobile telephones).

2. Description of Related Art

A switching mode power supply unit generally comprises a core, which is formed of switches, an inductor and a capacitor, and a control loop, which controls the core to obtain the required output voltage.

In a "current mode" switching mode power supply unit, the control loop conventionally includes a "slope compensator unit," which is necessary for maintaining the stability of the control loop for duty cycles exceeding 50%.

The slope compensator unit is in fact a current generator delivering a linear ramp. The unit is synchronized to a control signal in which the spacing between edges is related to the duty cycle between the required output voltage and the power supply voltage.

The slope compensator unit itself comprises two main components:
- a constant current source charging a capacitor (referred to as the "ramp" capacitor) when the control signal is at 0, for example, which produces a voltage ramp at the terminals of the ramp capacitor; when the control signal is at 1, the ramp capacitor is discharged and there is no voltage at its terminals, and
- a voltage/current converter which converts the voltage ramp at the terminals of the ramp capacitor into a current.

To limit the surface area in an integrated circuit occupied by the ramp capacitor in the slope compensator unit, a component is advantageously used having a high capacitance per unit surface area.

If the power supply voltage is subject to transient variations, a temporary loss of regulation is observed at the output of the switching mode power supply unit, and is a direct consequence of the behavior of the slope compensator unit.

The reason for this is: as the ramp capacitor of the slope compensator unit is referenced to the power supply voltage, in the event of transient variations in the power supply voltage a transient current is produced in the capacitor and is added to or subtracted from the current supplied by the current source which is intended to charge the capacitor with a constant current.

The final current ramp delivered by the slope compensator unit is therefore increased or decreased in the event of fast transient variations of the power supply voltage, which causes said temporary loss of regulation at the output of the switching mode power supply unit.

SUMMARY OF THE INVENTION

The present invention proposes a method of generating a voltage ramp at the terminals of a ramp capacitor having a first terminal connected to a power supply voltage. In accordance with the method, a charging phase is provided wherein the ramp capacitor is charged with a charge current delivered to the second terminal of the ramp capacitor. Additionally, a discharge phase is provided wherein the ramp capacitor is discharged. The charging and discharging phases are implemented cyclically.

According to a general feature of the invention, in the absence of transient variation in the power supply voltage, a charging current is delivered equal to a predetermined constant current and, in the presence of a transient variation in the power supply voltage, the transient current flowing in said ramp capacitor and generated by said transient variation is determined and a charging current is delivered equal to the algebraic sum of said predetermined constant current and an auxiliary current equal and opposite to the transient current.

Accordingly, whether the power supply voltage is subject to transient variations or not, the ramp capacitor is always charged by the current supplied by the constant current source.

In one particularly simple embodiment of the invention, the transient current can be determined by means of an auxiliary capacitor identical to the ramp capacitor.

To be more precise, in this embodiment, a first terminal of an auxiliary capacitor identical to the ramp capacitor is connected to the power supply voltage and the second terminal of the auxiliary capacitor is electrically decoupled from the second terminal of the ramp capacitor to prevent parallel connection of the two capacitors. The current flowing in the auxiliary capacitor in the event of a transient variation of the power supply voltage is an identical image of the transient current, said auxiliary current being equal and opposite to the image current.

The invention also provides an electronic device including a ramp capacitor having a first terminal connected to a power supply voltage and generator means connected to the second terminal of the ramp capacitor and adapted to generate a voltage ramp at the terminals of the ramp capacitor. According to a general feature of the invention, the generator means include a constant current source connected to the second terminal of the ramp capacitor and auxiliary means adapted in the presence of a transient variation of the power supply voltage to determine the transient current flowing in said ramp capacitor and generated by said transient variation and to deliver to the second terminal of the ramp capacitor a charging current equal to the algebraic sum of the constant current delivered by the constant current source and an auxiliary current equal and opposite to the transient current.

In one embodiment of the invention, the auxiliary means include:
- an auxiliary capacitor identical to the ramp capacitor and having a first terminal connected to the power supply voltage, a second terminal of the auxiliary capacitor is electrically decoupled from the second terminal of the ramp capacitor, the current flowing in the auxiliary capacitor in the event of a transient variation in the power supply voltage is an identical image of the transient current, and inverter means connected to the second terminal of the ramp capacitor are adapted to deliver a current equal and opposite to the image current.

In one embodiment of the invention the inverter means include a current mirror connected between the second terminal of the ramp capacitor and the second terminal of the auxiliary capacitor and biasing means adapted to bias the current mirror with a predetermined bias current allowing for the maximum amplitudes of transient variations in the power supply voltage that are to be permitted.

This bias current guarantees correct operation of the current mirror and thus effective ramp compensation.

The bias current can be at least three times the image current, for example.

In order not to disturb the rest current flowing in the two branches of the current mirror in the event of a transient variation in the power supply voltage, the biasing means preferably include a bias current source coupled to a cascode current mirror.

The ramp capacitor is preferably provided by a PMOS transistor, in order to obtain a capacitance which is-only very slightly dependent on the temperature variation and the technology. Furthermore, the constant current source is preferably capable of delivering a constant current proportional to the capacity per unit surface area of the PMOS transistor. This spread in the value of the capacitance associated with variations of the oxide thickness can be compensated in the constant current source.

The system according to the invention is advantageously implemented in the form of an integrated circuit.

The invention also provides a switching mode power supply unit including a slope compensator unit incorporating a system as defined above.

The invention further provides a remote terminal of a wireless communication system, for example a cellular mobile telephone, incorporating a switching mode power supply unit as defined above.

A beneficial result of the present invention is to eliminate virtually all of the influence of transient variations in the power supply voltage on the generation of the voltage ramp at the terminals of a ramp capacitor.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
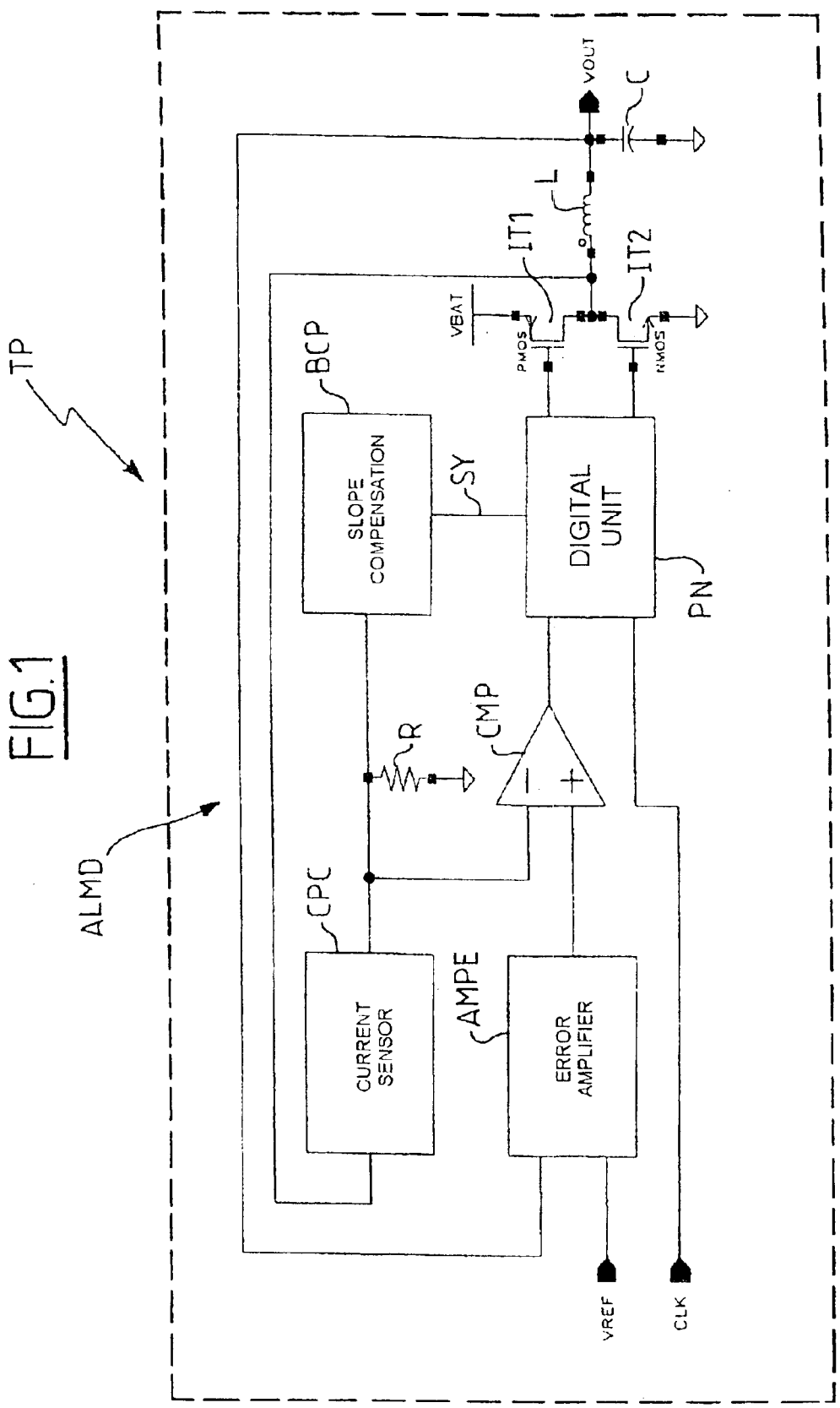
FIG. 1 is a diagram showing the main components of one embodiment of a switching mode power supply according to the invention.

In FIG. 1, the reference ALMD designates a switching mode power supply unit incorporated into a cellular mobile telephone TP, for example. It will be understood, however, that the present invention is not limited for use in such an environment.

In the example shown, the switching mode power supply unit is of the voltage step-down type in that the regulated voltage VOUT delivered to the output of the power supply unit ALMD is equal to the product of the power supply voltage VBAT and a coefficient $\alpha$ less than 1. The coefficient a is the duty cycle of the switching mode power supply unit.

The desired output voltage VOUT is a regulated voltage fixed by an external reference voltage VREF.

The person skilled in the art is familiar with the general structure and operation of the above kind of switching mode power supply unit. The main features thereof are outlined here: the switching mode power supply unit ALMD includes a core, which is formed of two switches IT1 and IT2, respectively consisting of a P-channel field-effect transistor (PMOS transistor) connected to the power supply voltage VBAT and an N-channel insulated-gate field-effect transistor (NMOS transistor) connected to ground. The core conventionally also includes an inductor L and a capacitor C. The switches IT1 and IT2 are closed and opened successively and alternately to store energy in the inductor and then retrieve the stored energy. The periods for which the switches are open and closed during each cycle depend on the duty cycle $\alpha$. The switching mode power supply unit ALMD also includes a control loop which controls the core to obtain the desired output voltage. The difference between the external voltage VREF and the output voltage VOUT is amplified in an error amplifier AMPE and the corresponding error voltage is compared in a comparator CMP to a ramp voltage at the other input of the comparator CMP. This ramp voltage results from the flow in the resistor R of a current delivered by a current sensor CPC and a current delivered by a slope compensator unit BCP. The current sensor provides an image of the current flowing in the inductor L when the PMOS transistor is conducting (switch IT1 closed). The component from the slope compensator unit stabilizes the voltage loop and the current loop. The output of the comparator CMP is fed to a digital unit PN timed by a clock signal CLK. The digital unit PN delivers the control signals for the switches IT1 and IT2 and a control signal for synchronizing the slope compensator unit BCP.

Figure 2:
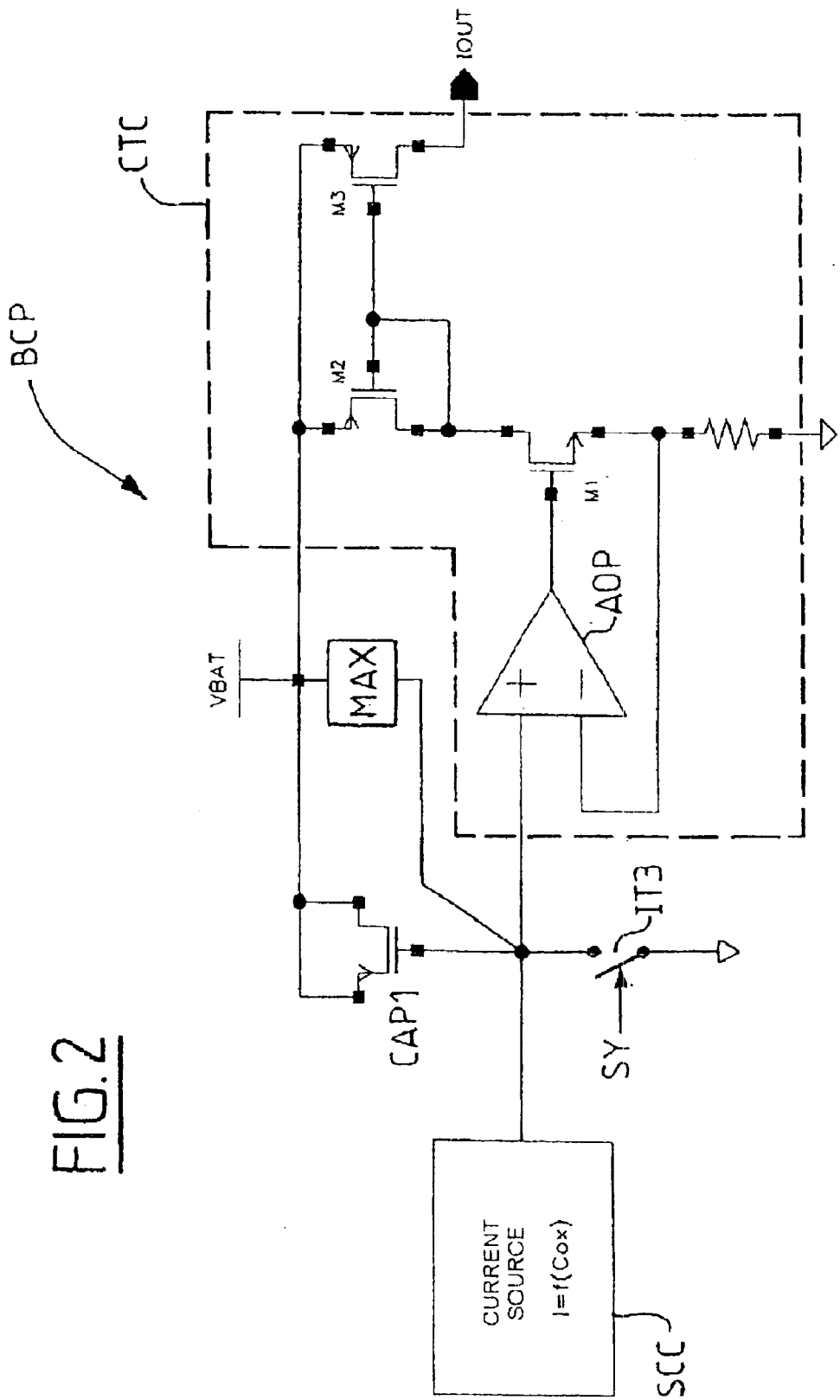
FIG. 2 is a diagram showing a slope compensator unit according to the invention.

As shown in FIG. 2, the slope compensator unit BCP includes a ramp capacitor CAP1 formed by a PMOS transistor whose source and drain are connected together to constitute a first terminal of the capacitor CAP1. This first terminal is connected to the power supply voltage VBAT.

The second terminal of the ramp capacitor CAP1 is formed by the gate of the PMOS transistor and is connected to ground via a switch IT3 controlled by the control signal SY delivered by the digital unit of the switching mode power supply unit.

In addition to the ramp capacitor CAP1, the slope compensator unit BCP includes a constant current source SCC connected to the second terminal of the ramp capacitor CAP1 and adapted to deliver a constant current which in this example is proportional to the capacitance per unit surface area Cox of the PMOS transistor. The person skilled in the art is familiar with this type of current source (see, for example, French patent application No. 2,789,532).

The unit BCP also includes auxiliary means MAX which, in the presence of a transient variation in the power supply voltage VBAT, determine the transient current flowing in the ramp capacitor and generated by said transient variation and deliver to the second terminal of the ramp capacitor CAP1 a charging current equal to the algebraic sum of the constant current delivered by the constant current source SCC and an auxiliary current equal and opposite to the transient current. This is explained in more detail later.

The ramp capacitor CAP1 is charged by a constant charge current when the switch IT3 is open and is then discharged when the switch IT3 is to be closed. This occurs cyclically, and a ramp voltage is therefore obtained at the terminals of the ramp capacitor CAP1.

In addition to the above means, the slope compensator unit BCP includes a voltage-current converter CTC which converts the voltage ramp at the terminals of the ramp capacitor CAP1 into a current IOUT. In this example the voltage-current converter CTC is an operational amplifier AOP connected to the second terminal of the ramp capacitor CAP1 and receiving feedback via an NMOS transistor M1 whose source is connected to ground via a resistor. The drain of the transistor M1 delivers the output current IOUT via a current mirror consisting of two PMS transistors M2 and M3.

Figure 3:
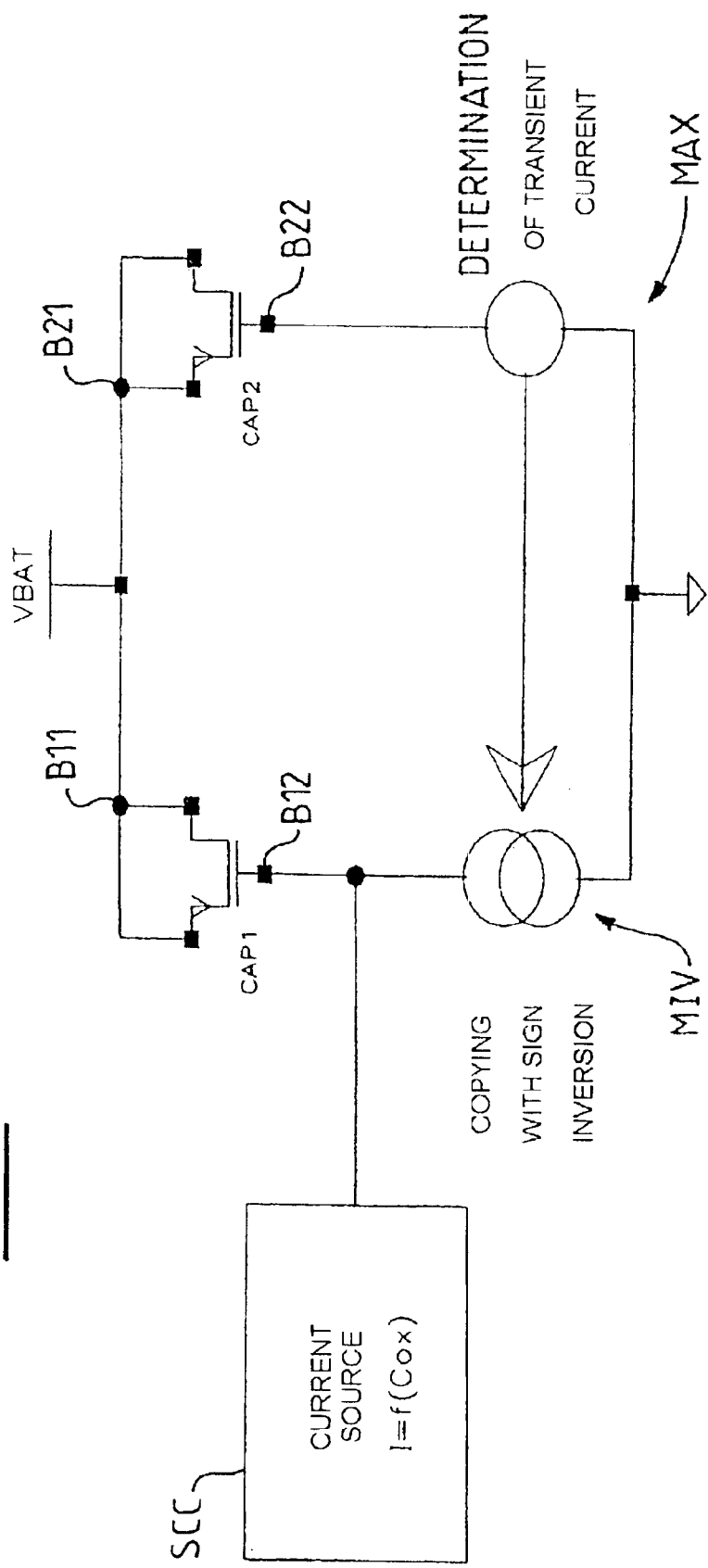
FIG. 3 is a diagram showing in more detail a portion of the slope compensator unit from FIG. 2.

FIG. 3 shows that the auxiliary means MAX include an auxiliary capacitor CAP2 identical to the ramp capacitor CAP1. In this example it is also formed by a PMOS transistor whose source and drain are connected together to constitute the first terminal B21 of the auxiliary capacitor, which is connected to the power supply voltage VBAT.

The second terminal B22 of the auxiliary capacitor is electrically decoupled from the second terminal B12 of the ramp capacitor. In other words, the auxiliary capacitor CAP2 is not electrically connected in parallel with the terminals of the ramp capacitor CAP1.

The current flowing in the auxiliary capacitor CAP2 in the event of a transient variation in the power supply voltage VBAT is then an identical image of the transient current flowing in the ramp capacitor CAP1 during the same transient variation in the power supply voltage. The auxiliary means MAX then include inverter means connected to the second terminal B12 of the ramp capacitor CAP1 and adapted to deliver a current equal and opposite to the image current. Accordingly, in the event of a transient variation in the power supply voltage VBAT, the transient current flowing in the ramp capacitor CAP1 and resulting from this variation is compensated by the image current injected into the gate of the ramp capacitor CAP1 and the charging current of the ramp capacitor therefore remains equal to the constant current delivered by the current source SCC.

Figure 4:
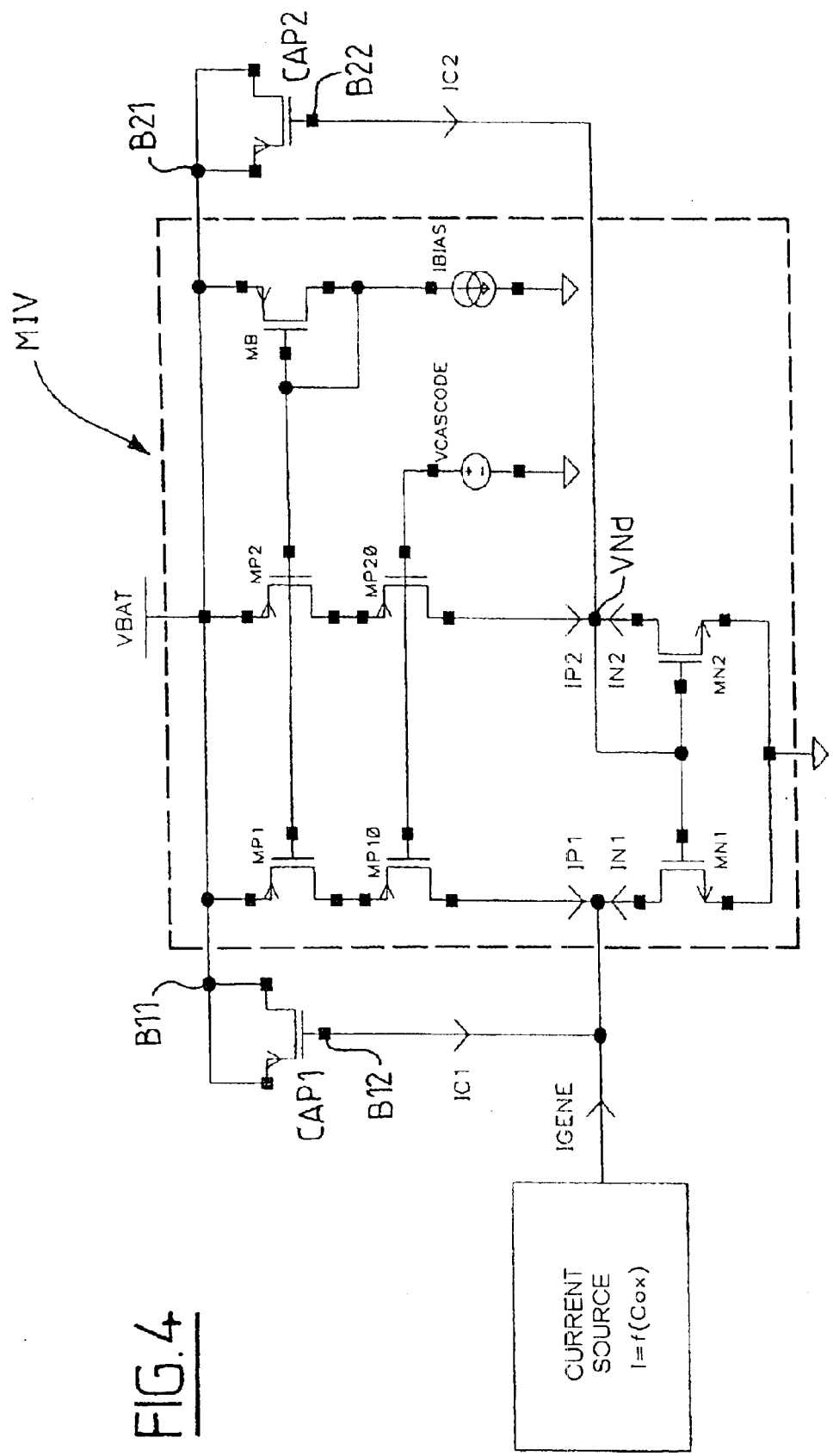
FIG. 4 shows in even more detail a portion of the slope compensator unit from FIG. 2.

FIG. 4 shows in more detail one embodiment of the auxiliary means MAX.

The current IC2 flowing in the auxiliary capacitor MC2 is copied and inverted in the event of a transient variation in the power supply voltage VBAT by a current mirror consisting of two NMOS transistors MN1 and MN2. The current mirror also provides electrical decoupling between the second terminal B22 of the auxiliary capacitor and the second terminal B12 of the ramp capacitor.

The current mirror is biased by biasing means delivering a bias current IBIAS. The compensation of the transient current flowing in the ramp capacitor by means of a current equal and opposite to the image current is fully effective provided that the drain currents IN1 and IN2 of the transistors MN1 and MN2 are equal. In the event of negative variations in the power supply voltage VBAT, the current IP2 is absorbed by the auxiliary capacitor CAP2. The current IN2 can therefore tend toward zero. Under these conditions, the current is no longer copied correctly between the transistors MN2 and MN1 and the compensation becomes ineffective.

Accordingly, to remedy this problem (i.e., to be able to compensate fast transitions in the power supply voltage), the current IP2 must be made sufficiently large. Because of this, a portion of the current IP2 can be absorbed by the auxiliary capacitor CAP2, with the remaining portion biasing the transistor MN2 and providing the current copying between the transistor MN2 and the transistor MN1.

Accordingly, it is necessary to choose the bias current IBIAS as a function of the amplitude of the transient variations in the power supply voltage that are to be permitted. A bias current IBIAS is generally chosen that is capable of maintaining the node ND1 at a constant potential higher than the gate/source voltage of the transistor MN2. The person skilled in the art knows how to adjust the bias current IBIAS. Nevertheless, to give an example, the bias current must be at least three times greater than the image current IC2, for example of the order of three to twenty times greater.

The biasing means of the current mirror MN1, MN2 include, in addition to the bias current source delivering the current IBIAS, a cascode current mirror MP1, MP2, MP10 and MP20. The cascode current mirror provides isolation from the power supply voltage VBAT so that the rest current IP2 is not disturbed in the event of variations in the power supply voltage VBAT.

Figure 5:
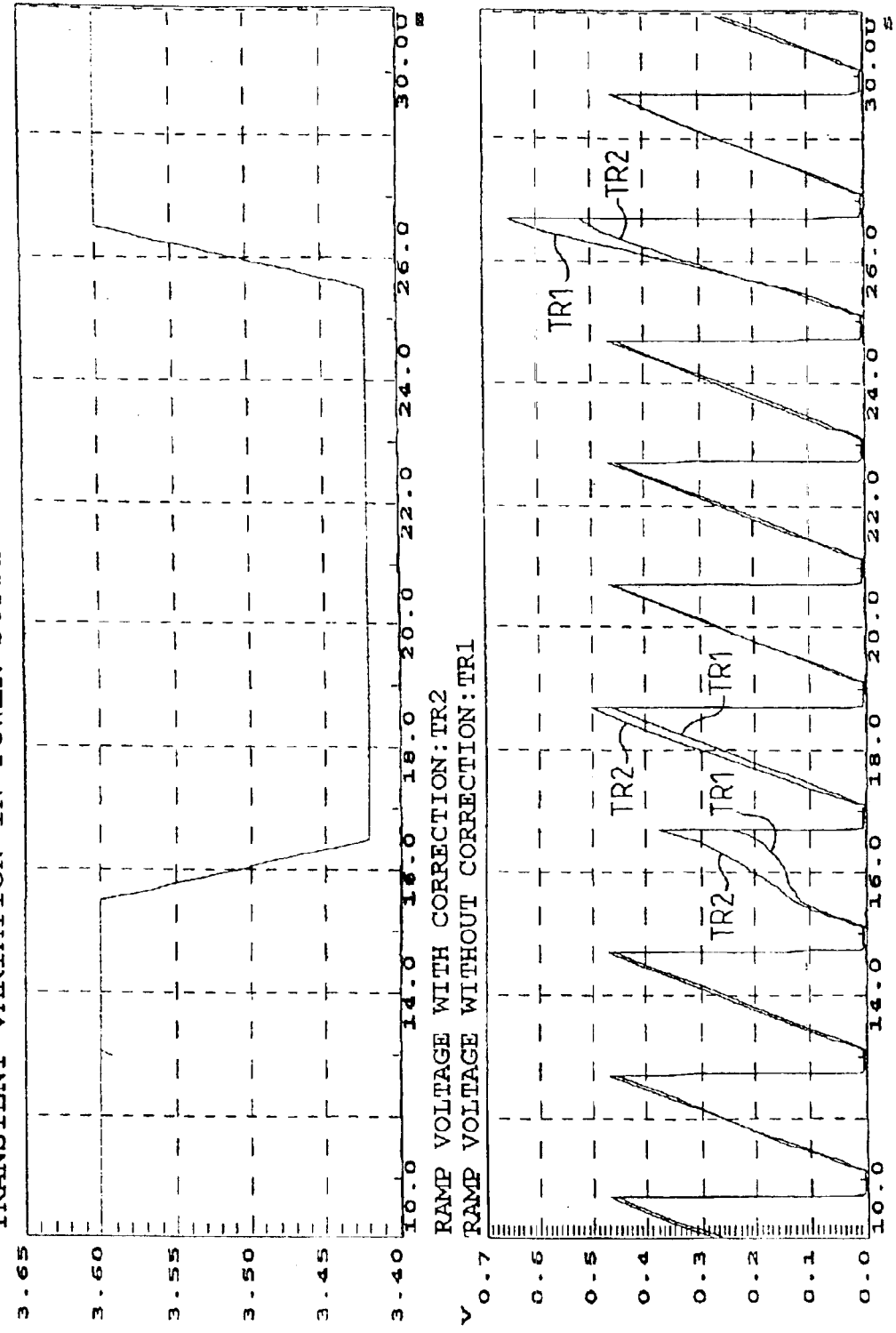
FIG. 5 shows a result obtained by using the invention.

FIG. 5 shows the effect obtained by the invention. The upper portion of FIG. 5 shows a transient variation in the power supply voltage VBAT and the lower portion of FIG. 5 shows a curve TR1 representative of a ramp voltage without correction in accordance with the invention and a curve TR2 representative of a ramp voltage with correction in accordance with the invention.

It can be seen that, when the transient variation occurs, the corrected ramp voltage TR2 remains below but in the vicinity of the voltage before the variation and is much higher than the uncorrected ramp voltage TR1. Similarly, when the variation in the power supply voltage disappears, the corrected ramp voltage TR2 remains above and in the vicinity of the ramp voltage in the absence of variation, and is much lower than the uncorrected ramp voltage TR1.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of generating a voltage ramp at the terminals of a ramp capacitor having a first terminal connected to a power supply voltage, said method including performing the following two steps cyclically:
    charging the ramp capacitor with a charge current delivered to the second terminal of the ramp capacitor; and
    discharging of the ramp capacitor;
    and wherein the step of charging further includes the steps of:
        delivering a charging current equal to a predetermined constant current in the absence of transient variation in the power supply voltage;
        determining, in the presence of a transient variation in the power supply voltage, a transient current flowing in said ramp capacitor due to that transient variation; and
        delivering, in the presence of a transient variation in the power supply voltage, the charging current equal to the algebraic sum of said predetermined constant current and an auxiliary current equal and opposite to the transient current.

2. The method according to claim 1, wherein a first terminal of an auxiliary capacitor identical to the ramp capacitor is connected to the power supply voltage, the method further including the step of electrically decoupling a second terminal of the auxiliary capacitor from the second terminal of the ramp capacitor such that the current flowing in the auxiliary capacitor in the event of a transient variation in the power supply voltage is an identical image of the transient current, and said auxiliary current is equal and opposite to the image current.

3. An electronic device including:
a ramp capacitor having a first terminal connected to a power supply voltage; and
generator means connected to a second terminal of the ramp capacitor and adapted to generate a voltage ramp at the terminals of the ramp capacitor;
the generator means including:
a constant current source connected to the second terminal of the ramp capacitor; and
an auxiliary circuit adapted in the presence of a transient variation of the power supply voltage to determine the transient current flowing in said ramp capacitor and generated by said transient variation, and to deliver to the second terminal of the ramp capacitor a charging current equal to the algebraic sum of the constant current delivered by the constant current source and an auxiliary current equal and opposite to the transient current.

4. The device according to claim 3, wherein the auxiliary circuit includes:
an auxiliary capacitor identical to the ramp capacitor and having a first terminal connected to the power supply voltage and a second terminal that is electrically decoupled from the second terminal of the ramp capacitor;
wherein the current flowing in the auxiliary capacitor in the event of a transient variation in the power supply voltage is an identical image of the transient current; and
an inverter circuit connected to the second terminal of the ramp capacitor and adapted to deliver a current equal and opposite to the image current.

5. The device according to claim 4, wherein the inverter circuit includes:
a current mirror connected between the second terminal of the ramp capacitor and the second terminal of the auxiliary capacitor; and
a biasing circuit adapted to bias the current mirror with a predetermined bias current allowing for the maximum amplitudes of transient variations in the power supply voltage that are to be permitted.

6. The device according to claim 5, wherein the bias current must be at least three times the image current.

7. The device according to claim 5, wherein the biasing circuit includes a bias current source coupled to a cascode current mirror.

8. The device according to claim 3, wherein the ramp capacitor is a PMOS transistor and the constant current source is adapted to deliver a constant current proportional to the capacitance per unit surface area of the PMOS transistor.

9. The device according to claim 3, wherein the device takes the form of an integrated circuit.

10. The device according to claim 3 wherein the device is implemented within a slope compensator unit of a switching mode power supply unit.

11. The device according to claim 10 wherein the switching mode power supply unit is implemented within a remote terminal of a wireless communication system.

12. The device according to claim 11, wherein the remote terminal is cellular mobile telephone.

13. A method, comprising the steps of:
delivering a constant charging current to a capacitor;
determining a transient current flowing in the capacitor due to transient variations in a supply voltage; and
delivering a charging current to the capacitor which is about equal to the algebraic sum of the constant charging current and an auxiliary current that is equal and opposite to determined transient current.

14. The method of claim 13 wherein the step of determining comprises the step of detecting the transient current by monitoring an auxiliary capacitor identical to the capacitor.

15. The method of claim 14 wherein the step of detecting comprises the steps of coupling the auxiliary capacitor to the supply voltage and decoupling the auxiliary capacitor from the capacitor such that current flowing in the auxiliary capacitor in the event of transient variations in the supply voltage is identical to that transient current flowing in the capacitor.

16. A circuit, comprising:
a capacitor having a first terminal connected to a supply voltage and a second terminal; and
a generator circuit connected to the second terminal of the capacitor, the generator circuit including:
a constant current source coupled to supply a constant current to the second terminal of the capacitor; and
a transient current source coupled to supply a transient current to the second terminal of the capacitor, the transient current source configured to deliver the transient current having a value sufficient to offset for transient currents in the capacitor which result from transient variations in the supply voltage.

17. The circuit of claim 16 further including an auxiliary capacitor having a first terminal connected to the supply voltage and a second terminal electrically decoupled from the second terminal of the capacitor, current in the auxiliary capacitor being affected by transient variations in the supply voltage.

18. The circuit of claim 17 wherein the transient current source comprises a current mirror operable to measure the value of transient currents in the auxiliary capacitor and generate based thereon the transient current for offset application to the capacitor.

19. The circuit of claim 18 further including a bias circuit that biases the current mirror with a bias current that accounts for transient variations in the supply voltage.

20. The circuit of claim 16 wherein the capacitor is implemented as a PMOS transistor structure.

21. The circuit of claim 16 wherein the circuit is implemented as a portion of a semiconductor integrated circuit.

22. The circuit of claim 21 wherein the portion comprises a slope compensator unit of a switching mode power supply.

23. The circuit of claim 16 wherein the value of the transient current supplied by the transient current source is opposite in polarity and substantially equal in magnitude to the transient currents in the capacitor which result from transient variations in the supply voltage.

24. A method, comprising the steps of:
delivering a constant charging current to a capacitor;
determining a transient current flowing in the capacitor due to transient variations in a supply voltage; and
delivering, along with the constant charging current, an auxiliary current to the capacitor that is substantially equal and opposite to the determined transient current.

25. The method of claim 24 wherein the step of determining further comprises the step of detecting the transient current by monitoring an auxiliary capacitor identical to the capacitor.

26. The method of claim 25 wherein the step of detecting further comprises the steps of coupling the auxiliary capacitor to the supply voltage and decoupling the auxiliary capacitor from the capacitor such that current flowing in the auxiliary capacitor in the event of transient variations in the supply voltage is identical to that transient current flowing in the capacitor.

27. A method comprising the steps of:
delivering, from a power supply, a supply voltage to a first terminal of a capacitor;
delivering, from a constant current source, a constant current to a second terminal of the capacitor;
delivering, from a transient current source, a transient current to the second terminal of the capacitor, the transient current having a value sufficient to offset for transient currents in the capacitor which result from transient variations in the supply voltage.

28. The method of claim 27, wherein a first terminal of an auxiliary capacitor is connected to the supply voltage, the method further including the step of electrically decoupling a second terminal of the auxiliary capacitor from the second terminal of the capacitor, a current in the auxiliary capacitor being affected by transient variations in the supply voltage.

29. The method of claim 28, wherein the transient current source comprises a current mirror operable to measure the value of a transient current in the auxiliary capacitor, and generate, based thereon, the transient current having a value sufficient to offset for transient currents in the capacitor.

30. The method of claim 29 further comprising the steps of:
biasing the current mirror with a bias current that accounts for transient variations in the supply voltage.

31. The method of claim 27, wherein the value of the transient current delivered by the transient current source is opposite in polarity and substantially equal in magnitude to the transient currents in the capacitor which result from transient variations in the supply voltage.

* * * * *

UNITED STATES PATENT AND TRADEMARK OFFICE
CERTIFICATE OF CORRECTION

PATENT NO.    : 6,838,916 B2
DATED         : January 4, 2005
INVENTOR(S)   : Christophe Premont et al.

It is certified that error appears in the above-identified patent and that said Letters Patent is hereby corrected as shown below:

<u>Column 3,</u>
Line 21, replace "which is -only" with -- which is only --.

<u>Column 4,</u>
Line 4, replace "a is the duty cycle" with -- α is the duty cycle --.

Signed and Sealed this

First Day of November, 2005

JON W. DUDAS
*Director of the United States Patent and Trademark Office*